(12) United States Patent
Satoh et al.

(10) Patent No.: US 7,324,353 B2
(45) Date of Patent: Jan. 29, 2008

(54) IMAGE DISPLAY APPARATUS AND SHIELD CASING THEREOF

(75) Inventors: Kazuto Satoh, Fukuroi (JP); Hideki Okabe, Fukuroi (JP); Yoshifumi Iketani, Fukuroi (JP); Koji Yamazaki, Fukuroi (JP); Takahiro Murakami, Fukuroi (JP); Hisanori Sato, Fukuroi (JP)

(73) Assignee: Pioneer Corporation, Tokyo (JP)

( * ) Notice: Subject to any disclaimer, the term of this patent is extended or adjusted under 35 U.S.C. 154(b) by 422 days.

(21) Appl. No.: 11/069,572

(22) Filed: Mar. 2, 2005

(65) Prior Publication Data

US 2005/0237728 A1 Oct. 27, 2005

(30) Foreign Application Priority Data

Mar. 2, 2004 (JP) ............................ P2004-057232

(51) Int. Cl.
*H05K 9/00* (2006.01)
(52) U.S. Cl. ................... 361/816; 361/681; 361/818; 361/680
(58) Field of Classification Search ................ 361/816, 361/681, 818, 689
See application file for complete search history.

(56) References Cited

U.S. PATENT DOCUMENTS 5,099,396 A * 3/1992 Barz et al. .................. 361/818
6,274,955 B1 * 8/2001 Satoh et al. .................. 310/71
6,442,028 B2 * 8/2002 Yamazaki .................... 361/704
6,498,733 B2 * 12/2002 Murasawa .................... 361/816
6,683,245 B1 * 1/2004 Ogawa et al. ............... 174/382
6,841,732 B2 * 1/2005 Yazaki ........................ 174/535
7,012,189 B2 * 3/2006 Kriege et al. ............... 174/377
7,265,984 B2 * 9/2007 Numata ....................... 361/719
2001/0019477 A1 * 9/2001 Murasawa .................... 361/816
2003/0231480 A1 * 12/2003 Mair et al. .................... 361/816
2004/0047139 A1 * 3/2004 Homer et al. ................ 361/816
2005/0117283 A1 * 6/2005 Lee et al. .................... 361/681
2006/0146505 A1 * 7/2006 Kim et al. .................... 361/752
2006/0197718 A1 * 9/2006 Yamate ........................ 345/37

FOREIGN PATENT DOCUMENTS

JP 2002-232180 A 8/2002

* cited by examiner

Primary Examiner—Tuan T. Dinh
Assistant Examiner—Hoa C Nguyen
(74) Attorney, Agent, or Firm—Sughrue Mion, PLLC

(57) ABSTRACT

A shield casing of an image display apparatus including a casing which covers other than a front surface of an image display device having an electromagnetic wave emitter and shielding the electromagnetic waves, a protection panel on which a conductive film is laminated, and a mounting device which is in contact with the conductive film and attaches the protection panel to the casing, wherein the mounting device has an arm stretching toward a front side of the protection panel, a tip portion of the arm curves toward the protection panel and has a contact surface with the protection panel on an outer side surface of the tip portion, and the mounting device mounts the protection panel to the casing with the force more than supporting the protection panel.

20 Claims, 5 Drawing Sheets

IMAGE DISPLAY APPARATUS AND SHIELD CASING THEREOF

BACKGROUND OF THE INVENTION

1. Field of the Invention

The present invention relates to a technical field of an image display apparatus and a shield casing of the image display apparatus.

2. Related Art

In a conventional technique, a shield casing of covering an entire electromagnetic wave generating body is known as a technique for shielding electromagnetic waves leaking from an electronics device. In such a shield casing, electromagnetic waves most tend to leak from a very narrow clearance between parts assembled each other. For example, a technique of preventing electromagnetic waves from leaking at this clearance by improving a mounting structure in view of a screw hole is disclosed in Japanese Unexamined Patent Publication No. JP-A-2002-232180, which is hereby incorporated by reference.

Generally, in an image display apparatus such as a plasma display panel (PDP), the image display apparatus is covered by an opaque cover in view of its design, and a transparent protection panel having an electromagnetic wave shielding effect is mounted on its display screen. The cover and the protection panel have substantially the same electric potentials for the electromagnetic wave shielding effect. Therefore, there is a need to give electrical conductivity between the cover and the protection panel.

SUMMARY OF THE INVENTION

The present invention is provided in consideration of the above. An object of the present invention is to provide a shield casing having a fixture that can maintain a pressure against a protection panel 1 and an image display apparatus having such a shield casing.

Another object of the present invention is to provide a shield casing for preventing electromagnetic waves from leaking without using a large number of screws and a bulky fixture.

According to the first aspect of the present invention, there is provided a shield casing of an image display apparatus comprising:

a casing which covers other than a front surface of an image display device having an electromagnetic wave emitter and shielding the electromagnetic waves;

a protection panel which is positioned on a front side of the image display device and on which a conductive film is laminated, and a mounting device which is in contact with the conductive film and attaches the protection panel to the casing, wherein the mounting device has an arm stretching toward a front side of the protection panel from a fixing portion of the mounting device to the casing, a tip portion of the arm curves toward a side of the protection panel and has a contact surface in contact with the protection panel on an outer side surface of the tip portion that is curved, and the mounting device mounts the protection panel to the casing with the force more than supporting the protection panel on the contact surface.

According to the second aspect of the present invention, there is provided the shield casing of an image display apparatus according to the first aspects, wherein the arm has two folded portions bent toward a side of the protection panel and the contact surface is formed on the tip portion of the folded portion.

According to the third aspect of the present invention, there is provided the shield casing of an image display apparatus according to the prior aspects, wherein the contact surface is divided into a plurality of surfaces.

According to the fourth aspect of the present invention, there is provided the shield casing of an image display apparatus according to the prior aspects, wherein the mounting device has a mounting surface provided with emboss and fixed to the casing through the mounting surface at the fixing portion.

According to the fourth aspect of the present invention, there is provided the shield casing of an image display apparatus according to the prior aspects, further comprising:

a second mounting device in contact with a bottom surface of the protection panel, wherein the second arm stretching from the fixing portion of the second mounting device to the casing toward the bottom surface of the protection panel, a rounded portion which is curved in a convex shape is formed at a tip portion of the second arm from a side of the casing to the front side of the protection panel, and the second mounting device is in contact with the bottom surface of the protection panel through a second contact surface.

According to the fifth aspect of the present invention, there is provided the shield casing of an image display apparatus according to the prior aspects, wherein the second surface is divided into a plurality of surfaces.

According to the sixth aspect of the present invention, there is provided the shield casing of an image display apparatus according to the prior aspects, wherein the second mounting device has a second mounting surface provided with emboss, and the shield casing is fixed to the casing through the second mounting surface at the fixing portion.

According to the sixth aspect of the present invention, there is provided an image display apparatus comprising: the shield casing according to the prior aspects, wherein the protection panel is mounted on the casing.

DESCRIPTION OF THE PREFERRED EMBODIMENTS

Figure 1:
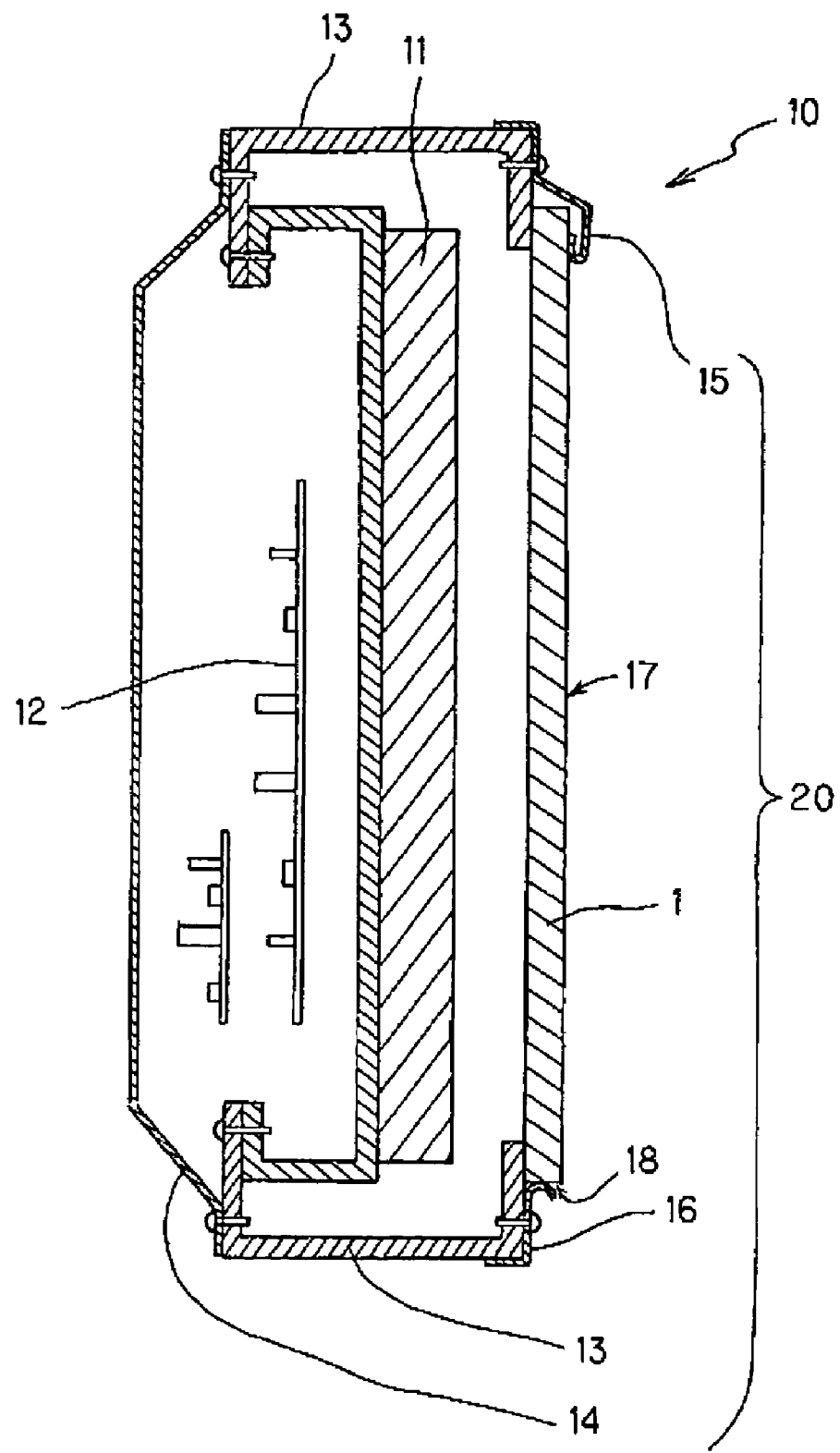
FIG. 1 is a longitudinal cross-sectional view of a PDP display apparatus according to an embodiment of the present invention.

Preferred embodiments of the present invention will be described in conjunction with figures. Hereinafter, each meaning of the reference numbers in the drawings is as follows: 1: protection panel, 10: PDP display apparatus, 11: display unit, 12: electric circuit, 13: frame, 14: cover, 15,15a,15b: fixture, 16: lower fixture, 17: conductive film, 18: copper film, 20: shield casing, 21: contact surface, 22,23: folded portion, 22b,23b: rounded portion, 25,25a,25b: flexible portion, 26: mounting surface, 31: contact surface, and 23: second arm.

EXAMPLE 1

Figure 2:
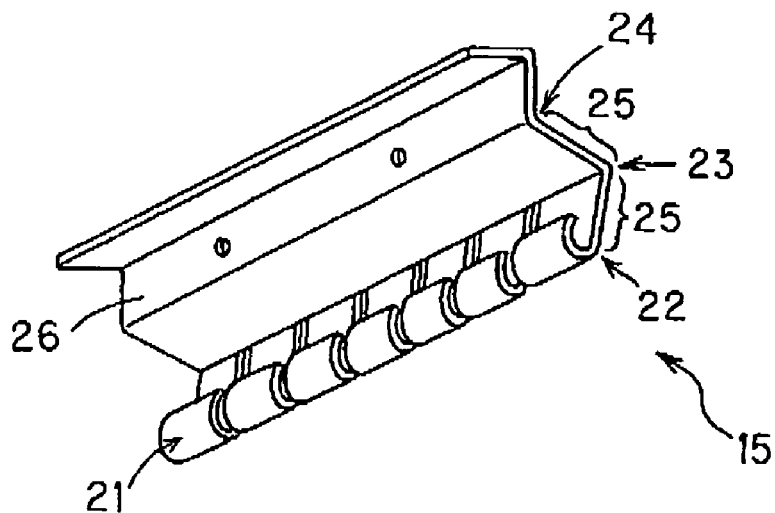
FIG. 2 is a perspective view of a fixture according to an embodiment of the present invention.
Figure 3:
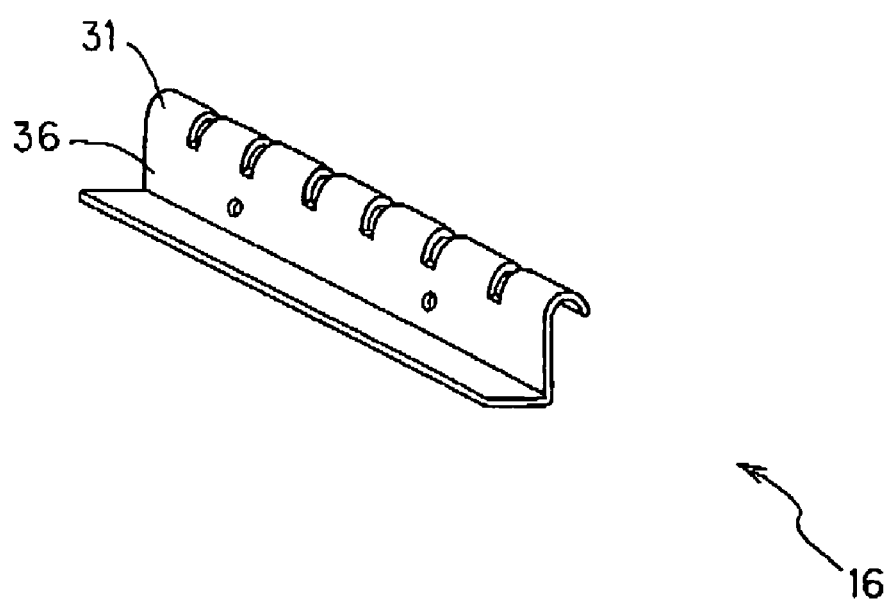
FIG. 3 is a perspective view of a lower fixture according to an embodiment of the present invention.
Figure 4:
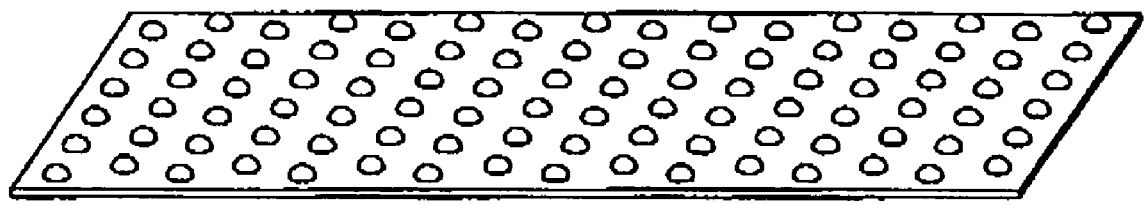
FIG. 4 shows an emboss provided on a mounting surface of a fixture according to an embodiment of the present invention.

FIG. 1 is a longitudinal cross-sectional view of a plasma display panel (PDP) display apparatus according to Example 1 of the present invention. FIG. 2 is a perspective view of a fixture according to Example 1 of the present invention. FIG. 3 is a perspective view of a lower fixture according to Example 1 of the present invention. FIG. 4 shows an emboss provided on a mounting surface of a fixture according to Example 1 of the present invention.

The PDP display apparatus 10 includes a display unit 11, an electric circuit 12 supplying an image signal and an audio signal to the display unit 11, a frame 13 for accommodating the display unit 11 and the electric circuit 12, a protection panel 1 arranged on the front surface of the display unit 11, and a cover 14 for covering side surfaces and a back surface of the display unit 11 and the electric circuit 12. The protection panel 1 is mounted to the frame 13 by a fixture 15 and a lower fixture 16. A shield casing includes the frame 13, the protection panel 1, the cover 14, the fixture 15, and the lower fixture 16.

The display unit 11 including, for example, a PDP and a speaker to output an image signal and an audio signal outputs an image and a voice upon receipt of an image signal and a voice signal.

The electric circuit 12 includes a power supply circuit for supplying an electric power to all over the PDP display apparatus, a drive circuit of causing an electric discharge from each cell of the PDP, and a signal circuit for transmitting an image signal and an audio signal, and disposed on the back surface of the display unit 11.

The frame 13 is formed by bending and welding a galvanized steel plate or a stainless steel plate. The units of the apparatus are attached to the frame 13.

For example, the protection panel 1 has a structure that a transparent film 17 is laminated on a surface of the glass as a substrate. Since the protection panel is transparent, it is possible to show an image displayed on the display unit 11 while avoiding leakage of electromagnetic waves.

The cover 14 is made from a plastic, a steel plate or the like. The cover 14 covers the electric circuit 12 to prevent dust from entering into the PDP display apparatus and takes a role of preventing electromagnetic disturbance from affecting electronics devices around the PDP display apparatus by a coat of demagnetizing paint on inner sides of the plastic cover.

For example, the fixture 15 and the lower fixture 16 are formed by bending a stainless steel plate and screwed to the frame 13.

The PDP display apparatus 10 according to this example corresponds to an image display apparatus according to the present invention. The display unit 11 according to this example corresponds to an image display device according to the present invention. The frame 13 according to this example corresponds to a casing according to the present invention. The protection panel 1 according to this example corresponds to a protection panel according to the present invention. The fixture 15 according to this example corresponds to a fixing device according to the present invention. The lower fixture 16 according to this example corresponds to a second fixing device according to the present invention. The electric conductive film 17 and the copper film 18 correspond to a conductive film according to the present invention. The shield casing 20 corresponds to a shield casing. The display unit 11 and the electric circuit 12 correspond to an electromagnetic wave generator according to the present invention.

Hereinafter, a summary of the shield casing 20 of the PDP display apparatus 10 having the above structure will be described.

When the PDP display apparatus is applied with electricity, there is a case where electromagnetic waves are emitted from the electric circuit 12. In order to prevent the electromagnetic waves from affecting other electronics devices around the PDP display apparatus, a periphery of the electric circuit 12 is surrounded by the cover 14.

Because an image is displayed by a light (color) emission generated inside each light emission cell which forms the display panel of the display unit 11, electromagnetic waves are emitted in the front side of the display unit 11. The electromagnetic waves are prevented from being emitted by mounting the transparent protection panel 1 in front of the display unit 11 so that the electromagnetic waves do not affect an operation of the other electronics devices located in front of the PDP display apparatus and do not reach the body of a viewer.

In other words, the electromagnetic waves emitted from the side surfaces and the back surface of the PDP apparatus are covered shielded by the cover 14, and emission of the electromagnetic waves are suppressed by the transparent protection panel on the front surface of the PDP panel to which a cover cannot be mounted.

However, when there is a gap in a butting portion between the protection panel 1 and the cover 14, electromagnetic waves may be emitted from the gap.

A fixture 15 shown in FIG. 2 has emboss shown in FIG. 4 on a mounting surface 26 against the frame. The emboss is continuously processed in two-dimensional directions of lengthwise and crosswise directions as shown in FIG. 4. The number of protrusions in the emboss are large. The frame 13 and the fixture 15 are in point-contact at the large number of protrusions.

This example has the following effects:

By provide the emboss on the mounting surface 26 of the fixture 15, deformation (warp) of the fixture 15 can be reduced. Accordingly, the gap from the frame is made small and leakage of electromagnetic waves is decreased;

Since the emboss is processed on the mounting surface 26, the protrusions of the emboss exist in the gap between the fixture 15 and the frame 13. Accordingly, the protrusions make the gap small so as to reduce leakage of the electromagnetic waves;

Since the protrusions on the mounting surface 26 are crushed by tightening a fixing screw, the frame 13 and the fixture 15 are in contact at a large number of points so as to reduce the gap to thereby reduce leakage of electromagnetic waves; and Since the leakage of electromagnetic waves is reduced by providing the emboss, it is unnecessary to increase the number of the fixing screws. Further, it is also unnecessary to increase the thickness of the fixture. Accordingly, the process in making the PDP display apparatus does not increase and also the weight of the PDP display does not increase.

The size, height, space, and density of the protrusions of the emboss are determined in a test while checking the above effects.

Next, a folded shape of the fixture 15 is described in reference of FIGS. 1 and 2.

As shown in FIGS. 1 and 2, the fixture 15 is folded at a folded portion 24 from a screwed-up portion and has a flexible portion 25 stretching in a side of front surface of the protection panel 1. The flexible portion 25 has two folded portions 23, 22 bent toward a side of the protection panel 1 on a front side of the protection panel 1. The fixture further has a rounded portion curving on the same side as the bending direction of the bending portions 23, 22. An outer side surface of the bending portion forms contact surfaces 21 which is in contact with the protection panel 1 and from which a sufficient pressure is applied toward the protection panel 1. The rounded portion has a large number of incisions to form a large number of contact surfaces 21.

The fixture 15 is in contact with the protection panel 1 through the contact surfaces 21 curved in a convex shape. More specifically, the fixture 15 is slightly bent over toward the protection panel 1. When the protection panel 1 is mounted, the flexible portion 25 slightly yields to against the protection panel 1.

In the fixture 15 having such a shape, since the contact surfaces 21 are in contact with the protection panel 1, when fold angles of the folded portions 22, 23 are forcibly opened in transporting the display apparatus or under aging phenomena, the force against the force of opening the folded portions 22, 23 from the contact surfaces 21 works. Accordingly, the force of pushing the protection panel 1 is maintained to be constant and the shape of the fixture 1 is maintained.

For example, the contact surfaces 21 according to this example corresponds to a contact surface according to the present invention. The folded portions 22, 23 correspond to a folded portion according to the present invention. The flexible portion 25 corresponds to an arm according to the present invention. The mounting surface 26 corresponds to a mounting surface according to the present invention.

According to the Example 1, the following effects are obtainable:

Since the pushing force can be maintained constant, an effect of preventing leakage of electromagnetic waves can be maintained constant without causing aging phenomena;

Since the protection panel 1 is mounted with the sufficient pushing force, the force of pushing the protection panel is constant and further has an addition of force;

Since the fixture 15 works to push the protection panel 1 toward the frame 13 in order to mount thereon, it is possible to absorb a stress caused depending on a difference of coefficients of thermal expansion of the fixture 1 and the protection panel 1;

Since the fixture 15 works to mount the protection panel 1 on a large number of contact surfaces 21 formed by the incisions, even though the contact portions are uneven, contacts at a large number of positions are secured; and Since the fixture 15 is in contact with the protection panel 1 through the outer contact surface 21 that curves in the convex shape so as to prevent point contact, a stress does not concentrate on the protection panel 1.

EXAMPLE 2

The Embodiment is not limited to the above Example 1 and can be modified as follows.

Figure 5A:
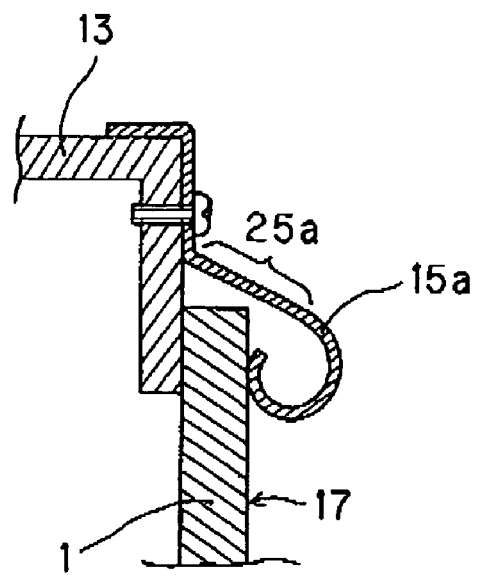
FIG. 5A shows a fixture according to another embodiment of the present invention.
Figure 5B:
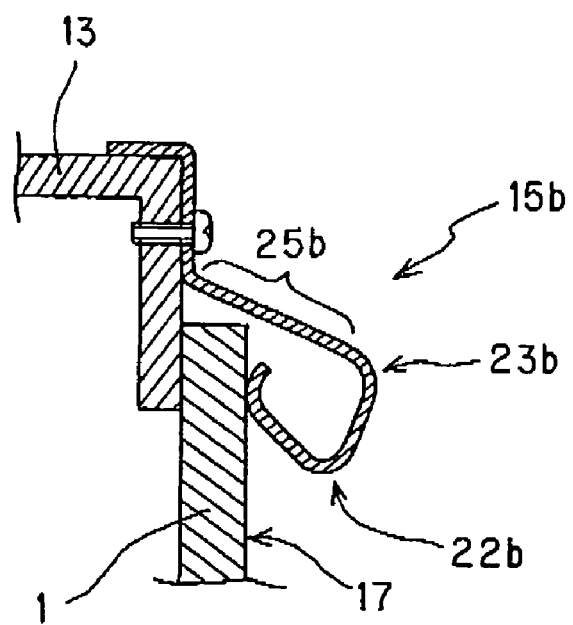
FIG. 5B shows a fixture according to another embodiment of the present invention.

FIG. 5A shows a fixture according to Example 2 of the present invention. FIG. 5B shows a fixture according to Example 2 of the present invention.

Although, in the Example 1, the fixture 15 has the two folded portions 23, 22 and the curved contact surfaces 21 the Embodiment is not limited thereto. As shown in FIG. 5A, a portion from a flexible portion 25a to contact surfaces with the protection panel 1 may be in a continuously curved shape. Instead, it may be in a shape of having two rounded portions 23b and 22b.

Next, mounting of a lower portion of a protection panel 1 will be described in reference of FIGS. 1 and 3. FIG. 5 is a perspective view of a lower fixture 16.

The lower fixture 16 is in a shape of having a second arm 36 and a rounded portion curved in a convex shape and starting from the second arm 36. The lower fixture 16 is in contact with a bottom surface of the protection panel 1 through a large number of contact surfaces 31 that are formed on the rounded portion by a large number of incisions. On the mounting surface of the second arm 36, emboss and a screw hole are provided.

The protection panel 1 is vertically mounted on a frame 13. A copper film 18 is laminated on a side surface (lower surface) of the protection panel 1. The protection panel 1 is in contact with the contact surfaces 31 of the lower fixture 16.

For example, the contact surfaces according to Example 2 correspond to a second surface according to the present invention. The second arm 36 according to Example 2 corresponds to a second arm according to the present invention. The mounting 10 surface of the second arm 36 on the protection panel side according to Example 2 corresponds to the second mounting surface according to the present invention.

This example has the following effects:

The protection panel 1 is in contact with the lower fixture 16 by the self weight of the protection panel 1. Therefore, an effect of preventing leakage of electromagnetic waves is maintained constant without aging phenomena;

Since the lower fixture is curved in a convex shape, even though it is deformed by receiving the weight of the protection panel 1 for a long time, the shape of the convex curvature is maintained and the pushing force between the protection panel 1 and the lower fixture 16 is maintained constant. Accordingly, an effect of preventing leakage of the electromagnetic waves can be maintained constant without aging phenomena;

Since the lower fixture 16 is in contact with the protection panel 1, a stress caused depending on a difference of coefficients of thermal expansions of the lower fixture 16 and the protection panel 1 can be absorbed;

Since the lower fixture 16 is in contact with the protection panel 1 on the large number of the contact surfaces formed by the incisions, even though the contact portions between the lower fixture 16 and the protection panel 1 are uneven, contact at a large number of positions is obtainable; and Since the lower fixture 16 is in contact with the protection panel 1 through the outer contact surfaces 31 curved in the convex shape so as to avoid point contacts in the contact portion, a stress is not concentrated in the protection panel 1.

EXAMPLE 3

Figure 6:
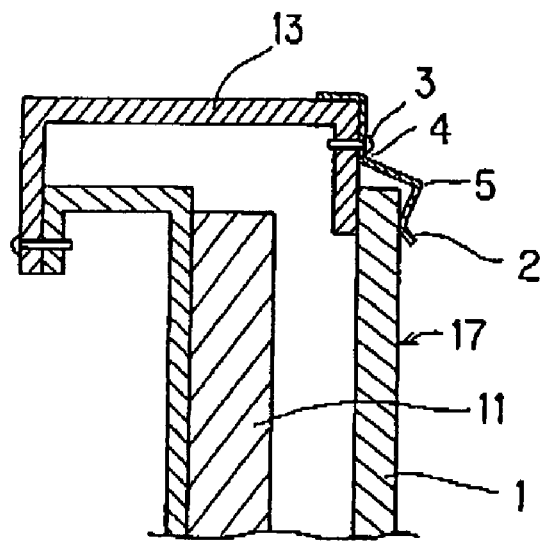
FIG. 6 shows a fixture according to another embodiment of the present invention.
Figure 7:
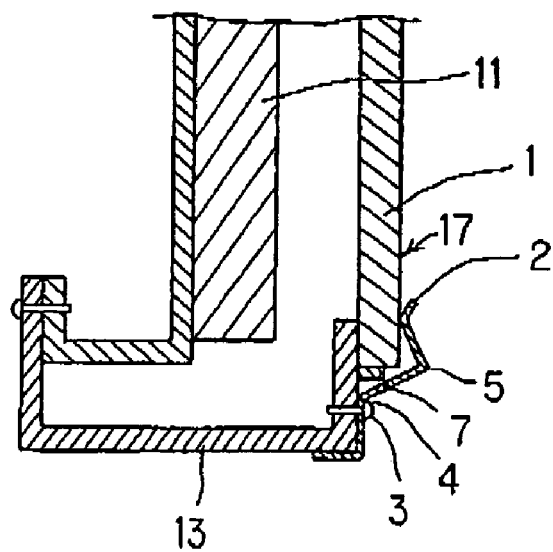
FIG. 7 shows a fixture according to another embodiment of the present invention.

Example 3 will be described in reference of FIGS. 6 and 7. FIG. 6 shows a fixture according to Example 3 of the present invention. FIG. 7 also shows a fixture according to Example 3 of the present invention. In an image display apparatus such as a plasma display panel (PDP), the image display apparatus is covered by an opaque cover in view of its design, and a protection panel having an electromagnetic wave shielding effect is provided on its display screen.

A cross-sectional view of a mounting state of the protection panel 1 is shown in FIG. 6.

The fixture 2 according to Example 3 has a screw-up portion 3, a mountain-folded portion 4, and a valley-folded portion 5. The fixture 2 is folded several times and in contact with a conductive film 17 attached to a protection panel 1 to press the protection panel against a casing 13 of the image display apparatus.

A cross-sectional view of a mounting state of a lower portion of the protection panel 1 is shown in FIG. 7.

In the lower portion, a protrusion 7 is formed on a frame 13. The protection panel 1 is mounted by the fixture 2 that presses the front side of the protection panel 1.

The present invention is not confined to the configurations listed in the foregoing embodiments, but it is easily understood that the person skilled in the art can modify such configurations into various other modes, within the scope of the present invention described in the claims.

The entire disclosures of Japanese Patent Applications No. 2004-57232 filed on Mar. 2, 2004 including the specification, claims, drawings and summary are incorporated herein by reference in its entirety.

What is claimed is:

1. A shield casing of an image display apparatus comprising:
  a casing which covers other than a front surface of an image display device having an electromagnetic wave emitter and shielding the electromagnetic waves;
  a protection panel which is positioned on a front side of the image display device and on which a conductive film is laminated, and
  a mounting device which is in contact with the conductive film and attaches the protection panel to the casing, wherein
  the mounting device has an arm stretching toward a front side of the protection panel from a fixing portion of the mounting device to the casing,
  a tip portion of the arm curves toward a side of the protection panel and has a contact surface in contact with the protection panel on an outer side surface of the tip portion that is curved, and
  the mounting device mounts the protection panel to the casing with the force more than supporting the protection panel on the contact surface.

2. The shield casing of an image display apparatus according to claim 1, wherein the arm has two folded portions bent toward a side of the protection panel and the contact surface is formed on the tip portion of the folded portion.

3. The shield casing of an image display apparatus according to claim 2, wherein the contact surface is divided into a plurality of surfaces.

4. The shield casing of an image display apparatus according to claim 3, further comprising:
  a second mounting device in contact with a bottom surface of the protection panel, wherein
  the second arm stretching from the fixing portion of the second mounting device to the casing toward the bottom surface of the protection panel,
  a rounded portion which is curved in a convex shape is formed at a tip portion of the second arm from a side of the casing to the front side of the protection panel, and
  the second mounting device is in contact with the bottom surface of the protection panel through a second contact surface.

5. The shield casing of an image display apparatus according to claim 2, wherein the mounting device has a mounting surface provided with emboss and fixed to the casing through the mounting surface at the fixing portion.

6. The shield casing of an image display apparatus according to claim 2, further comprising:
  a second mounting device in contact with a bottom surface of the protection panel, wherein
  the second arm stretching from the fixing portion of the second mounting device to the casing toward the bottom surface of the protection panel,
  a rounded portion which is curved in a convex shape is formed at a tip portion of the second arm from a side of the casing to the front side of the protection panel, and
  the second mounting device is in contact with the bottom surface of the protection panel through a second contact surface.

7. An image display apparatus comprising:
  the shield casing according to claim 2, wherein the protection panel is mounted on the casing.

8. The shield casing of an image display apparatus according to claim 1, wherein the contact surface is divided into a plurality of surfaces.

9. The shield casing of an image display apparatus according to claim 8, wherein the mounting device has amounting surface provided with emboss and fixed to the casing through the mounting surface at the fixing portion.

10. The shield casing of an image display apparatus according to claim 8, further comprising:
  a second mounting device in contact with a bottom surface of the protection panel, wherein
  the second arm stretching from the fixing portion of the second mounting device to the casing toward the bottom surface of the protection panel,
  a rounded portion which is curved in a convex shape is formed at a tip portion of the second arm from a side of the casing to the front side of the protection panel, and
  the second mounting device is in contact with the bottom surface of the protection panel through a second contact surface.

11. An image display apparatus comprising:
  the shield casing according to claim 8, wherein the protection panel is mounted on the casing.

12. The shield casing of an image display apparatus according to claim 1, wherein the mounting device has a mounting surface provided with emboss and fixed to the casing through the mounting surface at the fixing portion.

13. An image display apparatus comprising:
  the shield casing according to claim 12, wherein the protection panel is mounted on the casing.

14. The shield casing of an image display apparatus according to claim 1, further comprising:
  a second mounting device in contact with a bottom surface of the protection panel, wherein the second arm stretching from the fixing portion of the second mounting device to the casing toward the bottom surface of the protection panel, a rounded portion which is curved in a convex shape is formed at a tip portion of the second arm from a side of the casing to the front side of the protection panel, and the second mounting device is in contact with the bottom surface of the protection panel through a second contact surface.

15. The shield casing of an image display apparatus according to claim 14, wherein the second surface is divided into a plurality of surfaces.

16. The shield casing of an image display apparatus according to claim 15, wherein the second mounting device has a second mounting surface provided with emboss, and the shield casing is fixed to the casing through the second mounting surface at the fixing portion.

17. The shield casing of an image display apparatus according to claim 14, wherein the second mounting device has a second mounting surface provided with emboss, and the shield casing is fixed to the casing through the second mounting surface at the fixing portion.

18. An image display apparatus comprising:

the shield casing according to claim 17, wherein the protection panel is mounted on the casing.

19. An image display apparatus comprising:

the shield casing according to claim 14, wherein the protection panel is mounted on the casing.

20. An image display apparatus comprising:

the shield casing according to claim 1, wherein the protection panel is mounted on the casing.

* * * * *